(12) United States Patent
Khellah et al.

(10) Patent No.: US 7,206,249 B2
(45) Date of Patent: Apr. 17, 2007

(54) SRAM CELL POWER REDUCTION CIRCUIT

(75) Inventors: Muhammad M. Khellah, Tigard, OR (US); Dinesh Somasekhar, Portland, OR (US); Yibin Ye, Portland, OR (US); James Tschanz, Portland, OR (US); Stephen H. Tang, Pleasanton, CA (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/956,195

(22) Filed: Sep. 30, 2004

(65) Prior Publication Data

US 2006/0067109 A1    Mar. 30, 2006

(51) Int. Cl.
G11C 5/14    (2006.01)

(52) U.S. Cl. .................. 365/229; 365/227; 365/226; 365/156

(58) Field of Classification Search ............. 365/226, 365/227, 229, 156, 154
See application file for complete search history.

(56) References Cited

U.S. PATENT DOCUMENTS

| | | | |
|---|---|---|---|
| 5,325,338 A | 6/1994 | Runaldue et al. | 365/230.05 |
| 5,345,424 A | 9/1994 | Landgraf | 365/227 |
| 5,864,225 A * | 1/1999 | Bryson | 323/268 |
| 6,434,076 B1 | 8/2002 | Andersen et al. | 365/222 |
| 2003/0155962 A1 | 8/2003 | Itoh, et al. | 327/534 |
| 2003/0218914 A1* | 11/2003 | Kim et al. | 365/189.05 |
| 2005/0134162 A1 | 6/2005 | Hiraki | 313/346 R |
| 2005/0135162 A1 | 6/2005 | Somasekhar et al. | 365/189.06 |

\* cited by examiner

*Primary Examiner*—Andrew Q. Tran
(74) *Attorney, Agent, or Firm*—Blakely, Sokoloff, Taylor & Zafman LLP

(57) ABSTRACT

A method is described that comprises modulating the power consumption of an SRAM as a function of its usage at least by reaching, with help of a transistor, a voltage on a node within an operational amplifier's feedback loop. The voltage is beyond another voltage that the operational amplifier would drive the node to be without the help of the transistor. The voltage helps the feedback loop establish a voltage drop across a cell within the SRAM.

26 Claims, 4 Drawing Sheets

SRAM CELL POWER REDUCTION CIRCUIT

FIELD OF INVENTION

The field of invention relates generally to the electronic arts; and, more specifically, to an improved SRAM cell power reduction circuit.

BACKGROUND

The power consumption of electrical circuitry has emerged as, perhaps, the single largest threat to the continued advancement of semiconductor technology and its ability to craft new markets through the shrinking of transistor device size. Simply put, the smaller a transistor can be made, the more power will be consumed per transistor (owing to the transistor's faster speed and substrate leakage) and the more transistors can be fit onto a single chip of silicon. The combination of more transistors per chip and greater power consumption per transistor has resulted in some of the more advanced semiconductor chips under development exhibiting excessive heat dissipation.

Semiconductor chip designers are therefore focusing very intensely on re-designing legacy circuitry to consume less power than that of its predecessor design(s). One area of concern is the Static Random Access Memory (SRAM). SRAM stores bits of information in "cells" that contain active (i.e., "on") transistors. By comparison, Dynamic Random Access Memory (DRAM) stores bits of information in cells that contain passive capacitors.

Because active transistors consume more semiconductor surface area, consume more electrical power, but are faster than passive capacitors, SRAM memories have been relegated to applications requiring fast memory speeds at the expense of high surface area and electrical power consumption. With the present focus on reducing power consumption of electronic circuitry in general and with the high inherent power consumption of SRAM as a whole, SRAM designs have been the subject of intensive re-design efforts to reduce its power consumption characteristics.

FIGURES

The present invention is illustrated by way of example, and not limitation, in the figures of the accompanying drawings in which like references indicate similar elements and in which.

DETAILED DESCRIPTION

Figure 1:
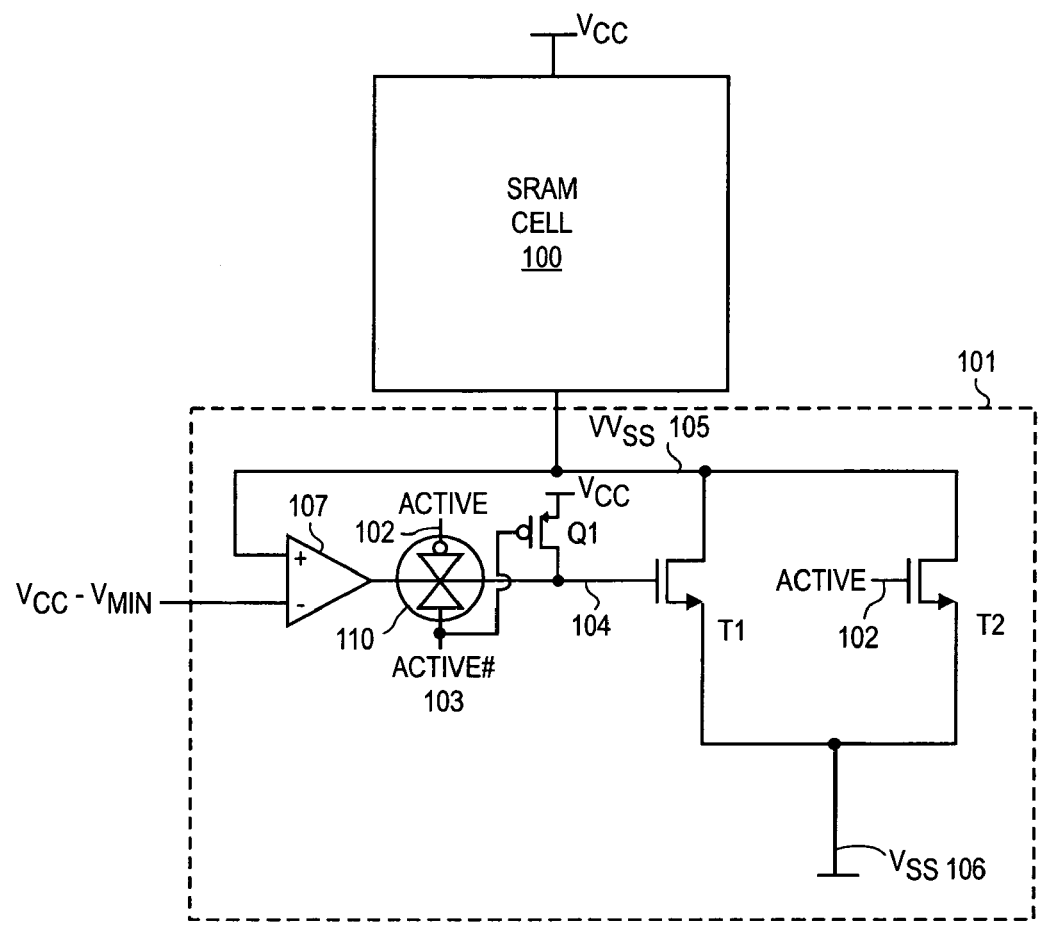
FIG. 1 shows a prior art SRAM cell power reduction circuit.

FIG. 1 shows a prior art design for reducing the power consumption of an SRAM. The design includes a basic SRAM cell 100 and power reduction circuitry 101. The power reduction circuitry takes advantage of the fact that an SRAM cell 100 can reliably hold its data even when it is "powered down" to some extent. That is, if a specific pattern of data is written into the SRAM cell 100, the voltage applied across the SRAM cell (Vcc–VVss) can be dropped (without corrupting the data that has been written into the SRAM cell 100) to something less than what is needed to read data from or write data to the SRAM cell 100. The voltage that is "something less than" what is needed to read/write data from/to the SRAM cell 100 is referred to in this application as "Vmin".

Thus, in periods of SRAM cell 100 idle time (i.e., when the SRAM cell is not being written to or read from), the power reduction circuitry 101 increases the voltage on the VVss node 105 to decrease the total voltage drop Vcc–VVss over the SRAM cell 100 to Vmin. In periods of SRAM cell 100 active time (i.e., when the SRAM cell 100 is being written to or read from), the power reduction circuitry 101 decreases the voltage on the VVss node 105 in order to increase the total voltage drop Vcc–VVss to a level needed to successfully write data to or read data from the SRAM cell 100. This level is greater than Vmin.

With the lower applied voltage Vmin across the SRAM cell 100 in periods of SRAM cell 100 idle time, the SRAM cell 100 will consumer less power during idle times than predecessor designs that did not modulate SRAM cell 100 supply voltage as a function of SRAM usage as described just above. It should be understood that, typically, large numbers of cells are organized into an SRAM array (not shown) of rows and columns. For any single read or write operation, a single cell is targeted (i.e., the cell whose particular row location and column location correspond to the read or write address being applied to the SRAM array).

Thus, for any single read or write operation, a single cell is "active" with all other cells being inactive/idle. In an embodiment, power reduction circuitry 101 is designed to lower the voltage applied to all cells coupled to an unselected row during a read or write operation (i.e., only the cells on a selected row receive full power). For simplicity, FIG. 1 and the present description only refers to and a single cell 100. However, it should be understood that in typical implementations the power reduction circuitry 101 will be coupled to more than one of the unselected cells in an SRAM array for any single read or write operation.

For example, in a further embodiment, a separate instance of power reduction circuitry 101 is created for each row in the SRAM array. For the particular row that is selected for a read or write operation, that row's power reduction circuitry applies full power to its row's cells. For each row that is not selected for a read or write operation, each row's power reduction circuitry 101 applies less than full power (Vmin) to its row's cells.

Conceivably, other architectures could be designed. For example, an architecture where there exists one power reduction circuit per column rather than per row. Another possibility is an architecture where there exists one power reduction circuit per sub-array of an SRAM array. Here, the entire SRAM array is broken down into sub-arrays. If a sub-array is not selected (i.e., a read or write address does not target a cell within the sub array), all cells within the sub-array are given less than full power (Vmin). If the sub-array is selected (i.e., a read or write address does target a cell within the sub array), all cells within the sub-array (or perhaps just the selected cell itself) is given full power.

Referring to FIG. 1, the primary control signals that are applied to the power reduction circuitry are the active and active# signals which are applied respectively to nodes 102 and 103. When the SRAM cell 100 is being written to with data, or, when data is being read from the SRAM cell 100, the SRAM cell 100 is deemed active (i.e., not idle). In this case, the active signal is a logic high and the active# signal is a logic low, and, the power reduction circuitry 101 lowers the voltage on the VVss node 105 as described immediately below.

When the active signal is at a logic high, transistor T2 is strongly "on"; and, when the active# signal is at a logic low, PMOS transistor Q1 is "on". When transistor T2 is strongly "on", it effectively creates a very low resistance current path (e.g., akin to a short circuit) from the VVss node 105 to the Vss node 106. Thus, the voltage on the VVss node 105 is pulled down to or near to that of the Vss node 106; which, in turn, corresponds to the dropping of the voltage on the VVss node 105 when the SRAM cell 100 is active as elaborated above. Here, most if not all current that flows from the SRAM cell 100 into the VVss node 105 when the SRAM cell 100 is active will flow through transistor T2 into the Vss node 106. In an embodiment Vcc is a "supply" voltage and Vss is at ground. Here, both supply and ground voltages can be regarded as "fixed" voltages.

With the voltage on the VVss node 105 being pulled down toward the voltage on the Vss node 106, the + input of operational amplifier (op amp) 107 will be less than the − input of op amp 107; which, in turn, causes the op amp 107 to attempt to drive its output voltage to its lower power supply rail.

Here, transmission gate 110 essentially behaves like a switch between the op amp 107 output and the gate node 104 of transistor T1. When the SRAM cell 100 is active (i.e., when active node 102 is at a logic high and active# node 103 is at a logic low as is presently being described), the transmission gate 110 essentially creates an open circuit between the op amp output and node 104. As such, the op amp 107 is free to drive its output to its lower power supply rail.

Moreover, with the transmission gate 110 behaving like an opened switch and with transistor Q1 being "on" (because active# node 103 is at a logic low), transistor Q1 will clamp node 104 to approximately the supply voltage Vcc; which, in turn, will turn transistor T1 "on".

According to a design approach, transistor T2 is a "large" or "standard sized" transistor (e.g., being large enough to handle most if not all of the current that flows from SRAM cell 100 when it is active) but the size of transistor T1 is "very small". Thus, even though transistor T1 is "on", transistor T1 will only carry a very small portion of the current that flows from the SRAM cell 100 when it is active.

Another feature of transistor T1 being "very small" is that transistor T1 will have a very small gain. The significance of transistor T1 having a very small gain is that, in order for it to effectively behave as an "off" transistor, a rather large voltage can nevertheless be applied to its gate. Better said, the practical cutoff voltage $|V_{GS}|$ for transistor T1 can be larger than is typical for standard transistors.

The importance of the ability to turn transistor T1 "off" with a relatively high voltage at node 104 may come into play when the SRAM cell 100 is in the idle state. Before discussing this aspect, however, it is prudent to first review the operation of the power reduction circuitry 101 when the SRAM cell 100 is in the idle state.

When the SRAM cell 100 is idle, the active and active# signals are at a logic low and logic high, respectively. A logic low at the gate of transistor T2 turns transistor T2 "off" and a logic high at the gate of PMOS transistor Q1 turns transistor Q1 "off". With transistor T2 being "off", transistor T2 will no longer clamp the voltage of the VVss node 105 to that of the Vss node 106. Moreover, with PMOS transistor Q1 being "off", PMOS transistor Q1 should have no effect on node 104.

Further still, the transmission gate 110 will now behave like a closed switch (e.g., akin to a short circuit) between the op amp 107 output node and node 104 because the active signal at node 102 will be low and the active# signal at node 103 will be high. As such, when the SRAM cell 100 is idle, op amp 107 will be free to control the voltage on the VVss node 105.

Specifically, the op amp 107 will be free to drive a "feedback loop" formed from the output 104 of the op amp 107, through transistor T1 to the VVss node 105 (which is coupled to the + input node of the op amp 107). When freely driven by the op amp 107 during the SRAM cell 100 idle state, the feedback loop will naturally settle the voltage on the + input of the op amp 107 (i.e., the VVss node 105) to approximately the voltage that is applied to the − input of the op amp 107 (owing to the op amp's large input impedance).

Noting that the − input of the op amp 107 is set to a voltage of Vcc−Vmin, it therefore follows that when the op amp 107 is free to drive the feedback loop, the VVss node 105 will be set to a voltage of Vcc−Vmin. Thus, when switching from the SRAM cell active to SRAM cell idle state, the voltage on node 105 will increase from approximately Vss to approximately Vcc−Vmin. This, in turn, corresponds to an applied voltage drop across the SRAM cell 100 of Vcc−(Vcc−Vmin)=Vmin. Recall that, at the onset of this description, Vmin was described as the voltage that is "something less than" the voltage applied across the SRAM cell 100 when it is active.

The op amp 107 during SRAM cell 100 idle time, in driving the feedback loop such that the VVss node 105 is at or near to a voltage of Vcc−Vmin, will set the voltage at the gate node 104 of transistor T1 to "whatever" gate voltage transistor T1 can sustain for a drain to source voltage drop across transistor T1 of (Vcc−Vmin)−Vss (i.e., the voltage drop across the conductive channel of transistor T1) while conducting the smaller amount of current that will flow out of the SRAM cell 100 while it is in the lower power idle state.

That is, the op amp 107 will drive the voltage level on node 104 to whatever gate voltage is sufficient for transistor T1 to carry the current that flows from the idle SRAM cell 100. For larger currents flowing from the idle SRAM cell 100, the op amp 107 will establish a higher voltage on node 104. For smaller currents flowing from the idle SRAM cell 100, the op amp 107 will establish a lower voltage on node 104. In a situation where the idle SRAM cell 100 provides no current beyond the leakage currents of transistor T2 and the + input op amp 107 itself, transistor T1 should be "off".

As alluded to above, because transistor T1 has a small gain, transistor T1 can be turned "off" with a relatively high voltage supplied by the op amp 107 at node 104. Being able to effectively turn transistor T1 "off" with a relatively high gate voltage allows op amp 107 to be "small" because the op amp 107 does not have to be designed to provide a full Vcc to Vss output voltage swing. That is, the lowest voltage the op amp 107 needs to provide on node 104 is something larger than Vss; which, in turn, corresponds to a designed-for op amp output voltage swing that is from Vcc to something larger than Vss.

The electrical power consumption and size of an op amp is generally proportional to its designed-for output voltage swing. As such, a design efficiency results from implementing transistor T1 with a small gain. Notably, a more efficient op amp 107 (in terms of semiconductor surface area and power consumption) can be designed into the power reduction circuitry 101 because it only needs to support an output voltage swing that is from Vcc to something larger than Vss. This stands in contrast to the alternative approach of implementing transistor T1 as a larger transistor with larger gain;

which, in turn, necessitates an op amp having a larger designed-for output voltage swing in order to turn the larger transistor off.

To review then, the voltage drop across the SRAM cell 100 when it is active is Vcc−VVss which in many applications is apt to be approximately equal to Vcc−Vss (owing to transistor T2 being "on" and clamping the VVss node 105 voltage to Vss when the SRAM cell 100 is active). By contrast, the voltage drop across the SRAM cell 100 when it is inactive is Vcc−(Vcc−Vmin)=Vmin. In many possible applications, Vmin<Vcc−Vss. Precisely speaking, Vmin<Vcc−VVss$_A$ where VVaa$_A$ is the voltage of the VVss node 105 when the SRAM cell is active. Along a similar train of though note that, in many applications, Vcc−VVss should be: 1) noticeably less than Vcc−Vss when the SRAM cell 100 is idle; and, 2) near equal to if not equal to Vcc−Vss when the SRAM cell 100 is active.

With the understanding that the smaller the designed-for output swing of op amp 107 the more efficient the overall design in terms of power consumption and semiconductor surface area consumption, note that, it is possible that some applications may impose a "large" Vmin while other applications may impose a "small" Vmin. Thus, an efficient power reduction circuitry 101 implementation should be able to efficiently handle both "large" and "small" Vmin voltages.

Applications that impose a "large" Vmin will result in more current flowing from the SRAM cell 100 while it is idle (simply because of the larger magnitude of the voltage applied across the SRAM cell); while, applications that impose a "small" Vmin will result in less current flowing from the SRAM cell 100 while it is idle (simply because of the smaller magnitude of the voltage applied across the SRAM cell).

More current flowing from the SRAM cell 100 while it is idle corresponds to transistor T1 needing a larger voltage at node 104 (i.e., larger $V_{GS}$ for transistor T1) in order to handle the current; while, less current flowing from the SRAM cell 100 while it is idle corresponds to transistor T1 needing a smaller voltage at node 104 (i.e., smaller $V_{GS}$ for transistor T1) in order to handle the current. The former (larger voltage at node 104) requires a larger op amp 107 output voltage swing, and, the later (smaller voltage at node 104) is practicable with a smaller op amp 107 output voltage swing.

Thus, the problem arises that those applications having larger idle SRAM cell 100 current flow (large Vmin) will "need" a larger, less efficient op amp than those applications having smaller idle SRAM cell 100 current flow (small Vmin). For those implementations that need to handle both large and small idle SRAM cell current flows, there is no choice with the power reduction circuit 101 of FIG. 1 other than to use the larger op amp so that the design is covered for those situations where small idle SRAM cell current exists.

Figure 2:
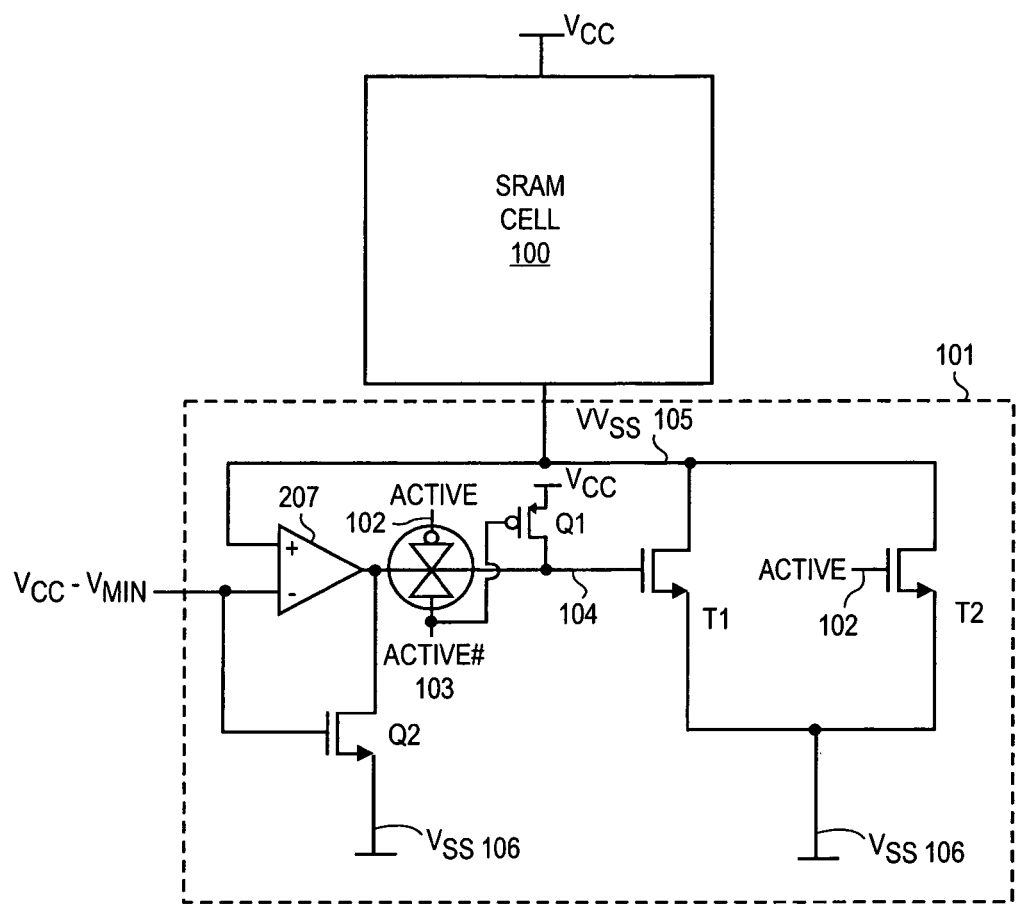
FIG. 2 shows an improved SRAM cell power reduction circuit.

A more desirable approach, however, is to implement a smaller op amp and yet be assured that it will work for both large and small idle SRAM cell currents. FIG. 2 shows a design for such an approach. According to the design of FIG. 2 and in retrospect to the design of FIG. 1, transistor Q2 has been added. If Vmin is small, transistor Q2 is "on" to help the smaller op amp 207 pull down the voltage on node 104 toward Vss. Here, if Vmin is small, less current will flow from the idle SRAM cell 100 resulting in a desire to drop the voltage on node 204 so that transistor T1 can be placed in an "off" or "quasi-off" state.

By contrast, if Vmin is large, transistor Q2 is "off". Having transistor Q2 "off" when Vmin is large is of no consequence, however, because a large Vmin results in larger idle SRAM cell current flow, and, larger idle SRAM cell current flow results in transistor T1 requiring a larger voltage on node 104. Here, because even a small op amp can reach Vcc at its output (i.e., the issue effecting output voltage swing is focused on the op amp's minimum output voltage), the op amp 207 does not need any "help" in reaching the proper voltage on node 104 from transistor Q2.

Thus, with the introduction of transistor Q2, a small op amp 207 can successfully handle both large and small currents flowing from the idle SRAM cell.

Figure 3:
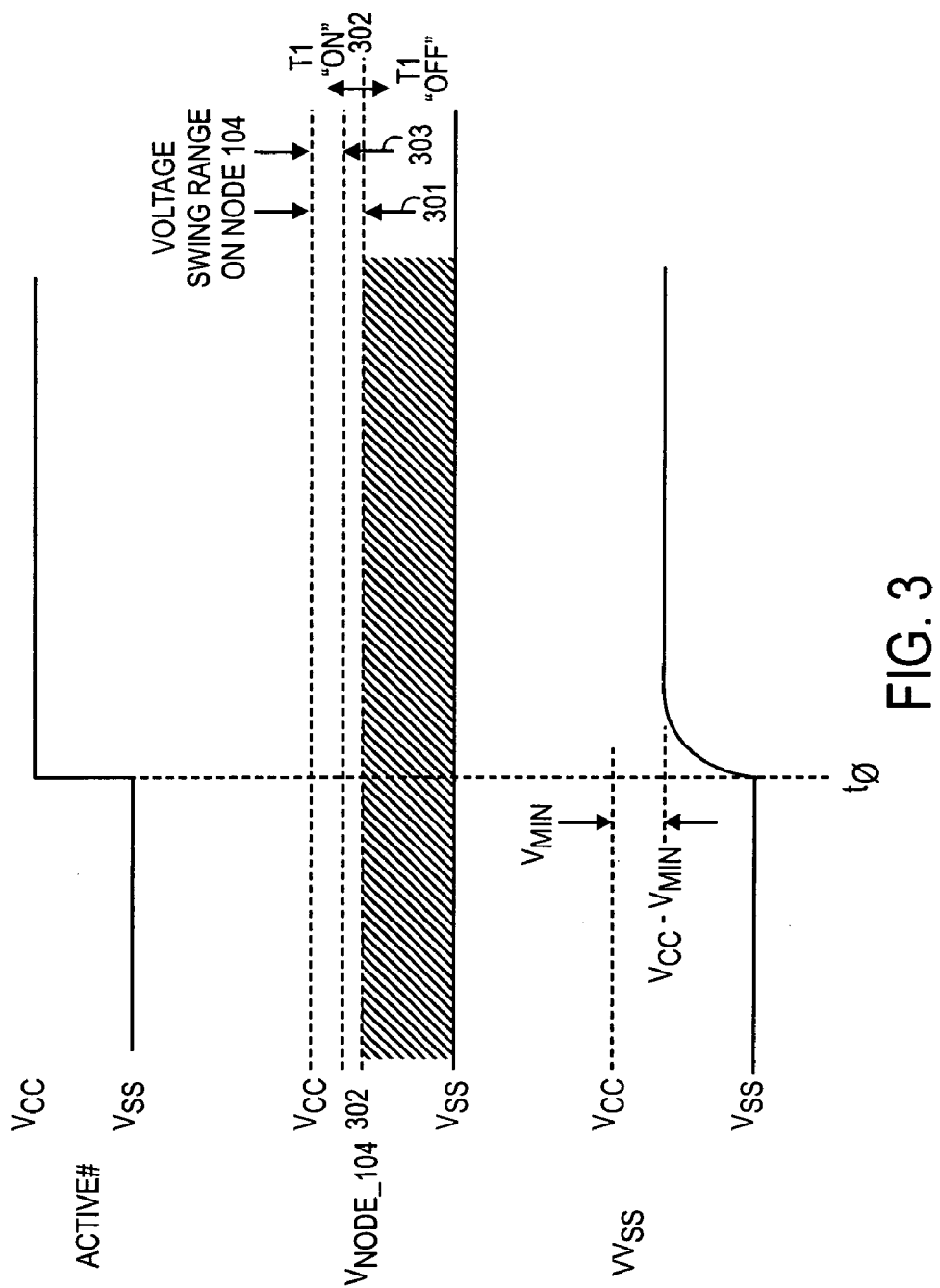
FIG. 3 shows waveforms associated with the circuits of FIGS. 1 and 2.

FIG. 3 shows active#, node 104 voltage and VVss node 105 waveforms which elaborate on the role of Q2 in greater detail. According to FIG. 3, the active# and VVss waveforms shows the increase in voltage on the VVss node 105 to a voltage Vcc−Vmin upon the SRAM cell 100 transitioning from an active state (prior to t0) to an idle state (after t0).

The voltage on node 104 shows a shaded portion beneath voltage level 302. Voltage level 302 corresponds to the effective cutoff voltage of transistor T1. That is, for voltages below voltage level 302, transistor T1 effectively behaves like an "off" transistor. With the cutoff voltage 302 of transistor T1 (or perhaps just beneath it) being the lowest voltage node 104 should ever need to reach, the full voltage swing on node 104 corresponds to voltage range 301.

According to the prior art circuit of FIG. 1, op amp 107 should be designed with a full voltage output swing that is at least coextensive with voltage range 301. By contrast, owing to the pull down assistance provided by transistor Q2 in reaching voltage level 302, op amp 207 can be designed to provide a smaller output swing. FIG. 3 qualitatively shows this smaller output swing as voltage range 303.

Figure 4:
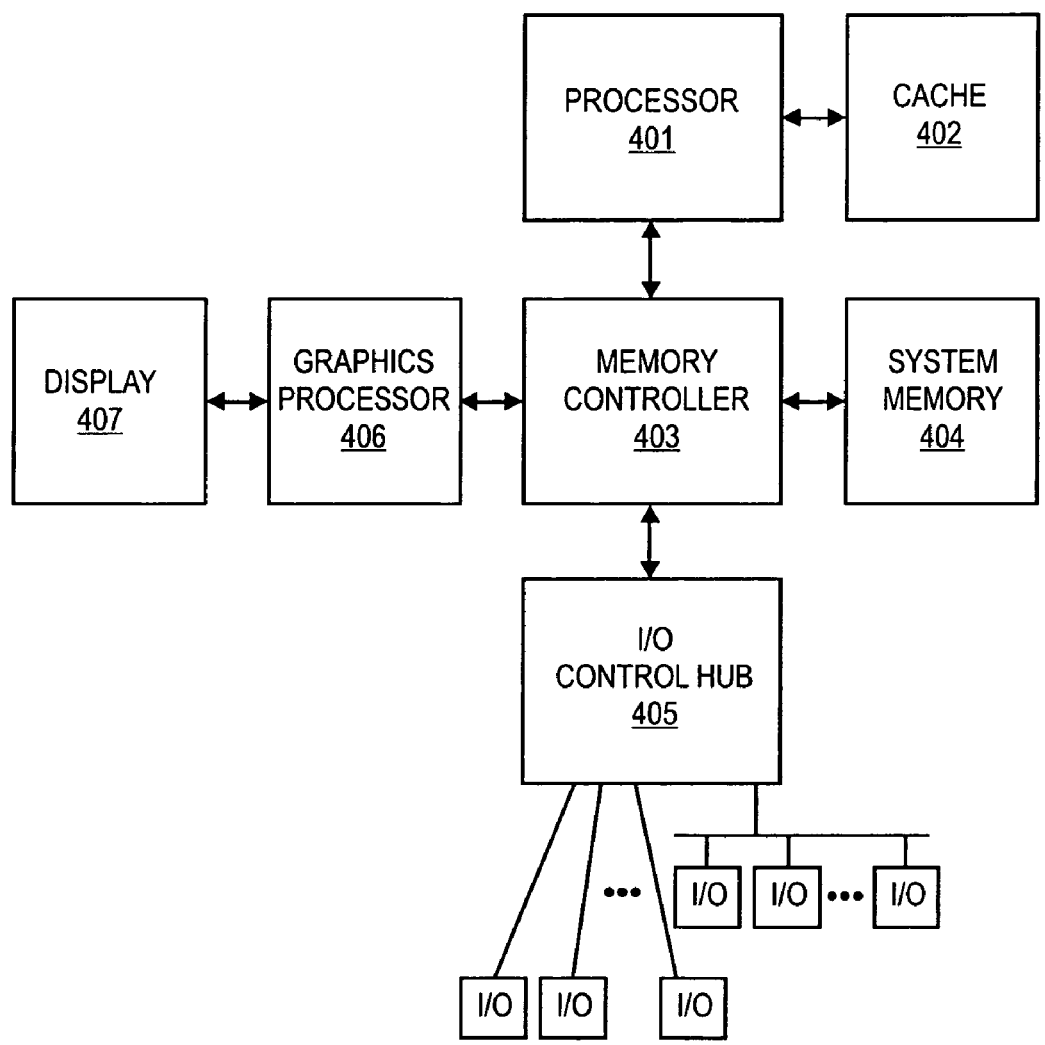
FIG. 4 shows a computing system.

FIG. 4 shows an embodiment of computing system architecture. The computing system includes a processor 401 that is coupled (e.g., over a back side bus) to a cache 402. The processor is coupled (e.g., over a front side bus) to a memory controller 403. The memory controller is coupled to a system memory 404, a graphics processor 406 and an I/O control hub 405. The graphics processor is coupled to a display 407. The I/O control hub 405 is coupled to various items of I/O through a bus and/or point-to-point link.

SRAM memory is typically used to implement the cache 402. Other "pockets" of SRAM for localized caching and/or queuing may be found in the graphics processor 406, memory controller 403 and I/O control hub 405. The system memory may take on various types such as Dynamic Data Rate (DDR), RDRAM or EDO. The display may take on various forms such as Liquid Crystal Display (LCD), Thin Film Transistor (TFT) or Cathode Ray Tube (CRT).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a) an SRAM cell; and,
b) an operational amplifier and a feedback loop, said feedback loop extending from an output of said operational amplifier to an input of said operational amplifier, said feedback loop coupled to said SRAM cell;

c) a transistor coupled between said feedback loop and a fixed voltage node, said transistor to extend a voltage range at said output beyond what said operational amplifier would provide if said transistor were not present.

2. The apparatus of claim 1 further comprising a first transistor coupled between said SRAM cell and a first fixed voltage node, said first transistor to provide said fixed voltage to said SRAM cell.

3. The apparatus of claim 2 further comprising a second transistor, said second transistor is part of said feedback loop and coupled to said fixed voltage node.

4. The apparatus of claim 3 wherein said second transistor has smaller gain than said first transistor.

5. The apparatus of claim 2 wherein said first transistor is also coupled to a signal line, said signal line to carry a signal that indicates whether said SRAM cell is in an active or idle state.

6. The apparatus of claim 1 further comprising a second input of said operational amplifier coupled to a voltage node, said voltage to appear at said input when said SRAM cell is in an idle state.

7. The apparatus of claim 6 wherein said feedback loop is coupled to a circuitry that is coupled to at least one signal line, said at least one signal line to carry one or more signals that each indicate whether said SRAM cell is in an active or idle state, said circuitry to free said operational amplifier so that said operational amplifier and said transistor will control application of a voltage applied across said SRAM cell while said SRAM cell is within said idle state.

8. The apparatus of claim 1 wherein said feedback loop is coupled to a circuitry that is coupled to at least one signal line, said at least one signal line to carry one or more signals that each indicate whether said SRAM cell is in an active or idle state, said circuitry to free said operational amplifier so that said operational amplifier and said transistor will control application of a voltage applied across said SRAM cell while said SRAM cell is within said idle state.

9. A method, comprising:
modulating the power consumption of an SRAM as a function of its usage at least by:
reaching, with help of a transistor, a voltage on a node within an operational amplifier's feedback loop, said voltage beyond another voltage that said operational amplifier would drive said node to be without said help of said transistor, said voltage helping said feedback loop establish a voltage drop across a cell within said SRAM.

10. The method of claim 9 further comprising turning said transistor on if said voltage drop is deemed to be small.

11. The method of claim 10 further comprising said turning said transistor on to cause a second transistor to cease conduction of current.

12. The method of claim 11 wherein said second transistor is part of said feedback loop.

13. The method of claim 9 wherein said voltage is less than said another voltage.

14. The method of claim 13 wherein said voltage is closer to ground than said another voltage.

15. The method of claim 9 further comprising said voltage helping said feedback loop to establish a voltage drop across a plurality of cells within said SRAM.

16. The method of claim 15 wherein said plurality of cells are along a same row within said SRAM.

17. The method of claim 15 wherein said plurality of cells are along a same column within said SRAM.

18. The method of claim 15 wherein said plurality of cells are within a same sub array of said SRAM.

19. A computing system, comprising:
(i) a processor coupled to a cache, said cache comprising
a) an SRAM cell; and,
b) an operational amplifier and a feedback loop, said feedback loop extending from an output of said operational amplifier to an input of said operational amplifier, said feedback loop coupled to said SRAM cell;
c) a transistor coupled between said feedback loop and a fixed voltage node, said transistor to extend a voltage range at said output beyond what said operational amplifier would provide if said transistor were not present; and,
(ii) an LCD display communicatively coupled to the processor through a graphics controller.

20. The apparatus of claim 19 further comprising a first transistor coupled between said SRAM cell and a first fixed voltage node, said first transistor to provide said fixed voltage to said SRAM cell.

21. The apparatus of claim 20 further comprising a second transistor, said second transistor is part of said feedback loop and coupled to said fixed voltage node.

22. The apparatus of claim 21 wherein said second transistor has smaller gain than said first transistor.

23. The apparatus of claim 20 wherein said first transistor is also coupled to a signal line, said signal line to carry a signal that indicates whether said SRAM cell is in an active or idle state.

24. The apparatus of claim 19 further comprising a second input of said operational amplifier coupled to a voltage node, said voltage to appear at said input when said SRAM cell is in an idle state.

25. The apparatus of claim 24 wherein said feedback loop is coupled to a circuitry that is coupled to at least one signal line, said at least one signal line to carry one or more signals that each indicate whether said SRAM cell is in an active or idle state, said circuitry to free said operational amplifier so that said operational amplifier and said transistor will control application of a voltage applied across said SRAM cell while said SRAM cell is within said idle state.

26. The apparatus of claim 19 wherein said feedback loop is coupled to a circuitry that is coupled to at least one signal line, said at least one signal line to carry one or more signals that each indicate whether said SRAM cell is in an active or idle state, said circuitry to free said operational amplifier so that said operational amplifier and said transistor will control application of a voltage applied across said SRAM cell while said SRAM cell is within said idle state.

* * * * *